United States Patent [19]

Moulden

[11] 4,333,123
[45] * Jun. 1, 1982

[54] ANTISTATIC EQUIPMENT EMPLOYING POSITIVE AND NEGATIVE ION SOURCES

[75] Inventor: R. Edward Moulden, San Gabriel, Calif.

[73] Assignee: Consan Pacific Incorporated, Whittier, Calif.

[*] Notice: The portion of the term of this patent subsequent to Mar. 9, 1999, has been disclaimed.

[21] Appl. No.: 153,257

[22] Filed: May 27, 1980

Related U.S. Application Data

[63] Continuation-in-part of Ser. No. 135,544, Mar. 31, 1980, Pat. No. 4,319,302, which is a continuation-in-part of Ser. No. 80,272, Oct. 1, 1979, abandoned.

[51] Int. Cl.$^3$ .............................................. H05F 3/06
[52] U.S. Cl. .................................... 361/213; 361/229
[58] Field of Search ............... 361/212, 213, 226, 227, 361/229, 231, 235

[56] References Cited

U.S. PATENT DOCUMENTS

| | | | |
|---|---|---|---|
| 2,497,604 | 2/1950 | Henry et al. | 361/213 |
| 3,498,541 | 3/1970 | Taylor, Jr. et al. | 361/227 X |
| 3,582,711 | 6/1971 | Jahnke | 361/235 X |

FOREIGN PATENT DOCUMENTS

| | | | |
|---|---|---|---|
| 2547390 | 5/1977 | Fed. Rep. of Germany | 361/212 |
| 2631096 | 1/1978 | Fed. Rep. of Germany | 361/229 |
| 720719 | 12/1954 | United Kingdom | 361/231 |
| 769769 | 3/1957 | United Kingdom | 361/213 |

OTHER PUBLICATIONS

"Particulate Remover"—Pridans, IBM Technical Disclosure Bulletin, vol. 19, No. 10, 3/1977, p. 3684.

Primary Examiner—Harry E. Moose, Jr.
Attorney, Agent, or Firm—William W. Haefliger

[57] ABSTRACT

Apparatus for generating and dispersing ions, comprises:
  (a) first and second tip means aimed generally longitudinally forwardly, said first tip means spaced laterally from said second tip means,
  (b) circuit means to supply high voltage of relatively positive polarity to the first tip means and high voltage of relatively negative polarity to the second tip means, and
  (c) insulative structure, including a barrier extending generally forwardly to separate positive ions dispensed generally forwardly of the first tip means from negative ions dispensed generally forwardly of the second tip means.

The first and second tip means may be located in insulative, parallel tubes which are endwise open and located in the surrounding tube through which gas is caused to flow; or the barrier may comprise a plate or wall which extends forwardly of the tips.

23 Claims, 12 Drawing Figures

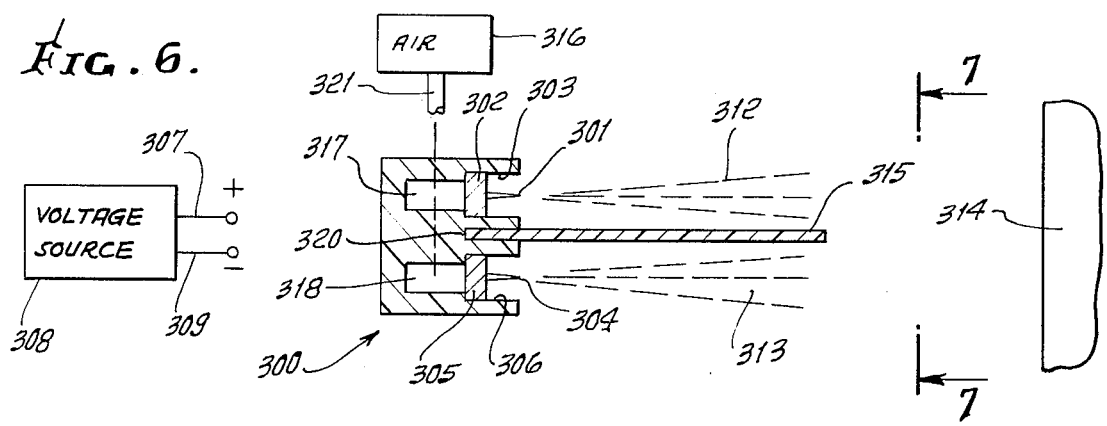
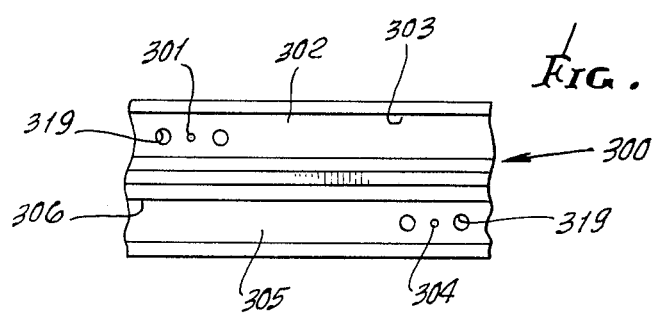
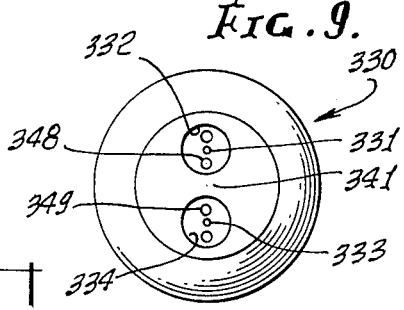
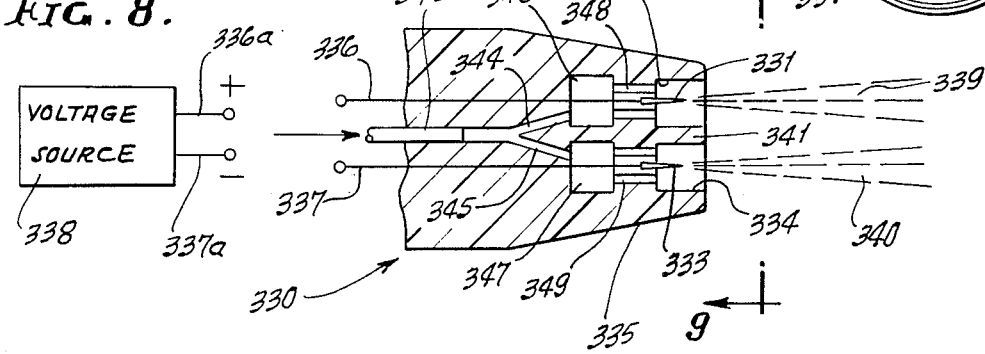
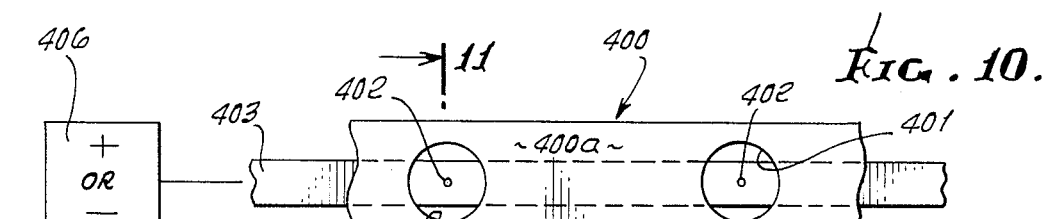
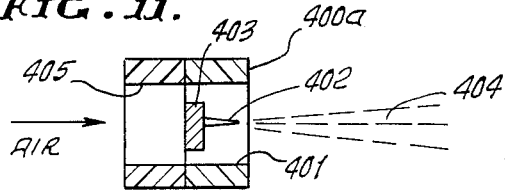
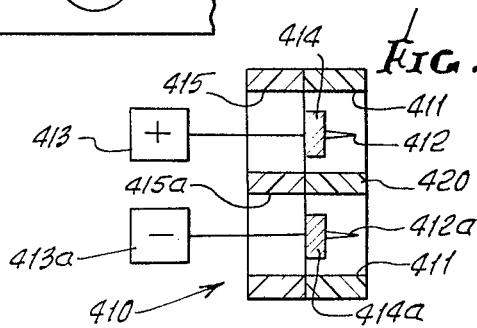

ANTISTATIC EQUIPMENT EMPLOYING POSITIVE AND NEGATIVE ION SOURCES

This application is a continuation-in-part of my prior application Ser. No. 135,544, filed Mar. 31, 1980, now U.S. Pat. No. 4,319,302 filed 3/9/82 which was a continuation-in-part of my prior application Ser. No. 80,272, filed Oct. 1, 1979, now abandoned.

BACKGROUND OF THE INVENTION

This invention relates generally to antistatic treatment of electrically charged objects and more particularly concerns improvements in ion generation and dispensing apparatus for altering the static charge on work surfaces, and materials.

It is often found in manufacturing processes, that static charge of changing polarity, or difficult to ascertain polarity and intensity, develops on work surfaces. For example, in manufacturing electrical circuit boards, and other products, it is found that static charges develop, as for example in the conductive circuitry. Such charges can and do at times injure sensitive electrical components on such boards, whereby expensive scrapping of the boards becomes necessary. Interferences with computers, and possible shocks and fires can occur. Nuclear equipment to neutralize static charge is also inefficient. Insofar, as I am aware, no way was known prior to the present invention to eliminate these problems in the novel manner as now afforded by the invention.

SUMMARY OF THE INVENTION

It is a major object of the invention to provide apparatus and method characterized as overcoming the above described problems as well as problems with the equipment or products where electrical neutralization is necessary. Basically, the apparatus of the invention comprises:

(a) first and second tip means aimed generally longitudinally forwardly, said first tip means spaced laterally from said second tip means, (b) circuit means to supply high voltage of relatively positive polarity to the first tip means and high voltage of relatively negative polarity to the second tip means, and (c) insulative structure, including a barrier extending generally forwardly to separate positive ions dispensed generally forwardly of the first tip means from negative ions dispensed generally forwardly of the second tip means.

As will appear, the circuit means may include a source of alternating high voltage, rectifiers and capacitors in parallel branches to which the tips are respectively connected and isolation resistors, the rectifiers poled to product positive voltage at one tip and negative voltage at the other tip; the barrier may project forwardly relative to the tips and may comprise a wall or part of a tube or tubes; air or gas flow may be provided to enhance ion travel toward the work; the tips may be located in parallel, spaced apart insulative tubes or ducts which are open ended, and a larger tube or duct may receive the smaller tubes all in such manner that air flow through all tubes occurs to enhance the neutralizing effect; the spacing of the tips from the forward ends of the tubes may be selected or adjusted to enhance ion projection and/or to vary relative positive and negative in production; and pivoted housing structure may be provided for the tubes. Accordingly, the work is bathed in positive and negative ions sufficiently mixed to neutralize the work, the ions supplied during the same or during alternating time intervals.

It is another object of the invention to provide a method of generating and dispersing ions for electrically neutralizing articles, and employing tips means as referred to, the method including the steps:

(a) supplying high voltage of relatively positive polarity to the first tip means to generate a stream of positive ions, (b) supplying high voltage of relatively negative polarity to the second tip means to generate a stream of negative ions, (c) providing insulative structure including a barrier located to separate said two streams, and (d) causing said ion streams to travel toward at least one of said articles.

Further, the articles may comprise work surfaces, as for example circuit boards having electrical components which become statically neutralized by means of the invention; enhancement of neutralization may be achieved by flowing gas such as air forwardly about the tips and toward the article or articles; the positive and negative voltages may be approximately equal in absolute value, for neutralization purposes; and gas such as air may be aspirated in response to ion stream travel. Other processes where the invention is usable include printing (such as letter press, offset, ratograverse); silk screening, film treatment; plastic and paper bag making and slitting; neutralization of plastic and paper trimmings enabling baling; textile processing; and flowing bulk particle neutralization.

The invention improves over the devices described in U.S. Pat. No. 3,308,344 to Smith et al, and No. 3,976,916 to Saurenman.

These and other objects and advantages of the invention, as well as the details of an illustrative embodiment, will be more fully understood from the following description and drawings in which:

DRAWING DESCRIPTION

FIG. 6 is a section, in elevation, showing a further modification;

FIG. 7 is an elevation taken on lines 7—7 of FIG. 6;

FIG. 8 is a section, in elevation, showing yet another modification;

FIG. 9 is an end elevation taken on lines 9—9 of FIG. 8;

FIG. 10 is a top plan view of a further modification;

FIG. 11 is a section on lines 11—11 of FIG. 10; and

FIG. 12 is a view like FIG. 11, showing another modification.

DETAILED DESCRIPTION

Figure 2:
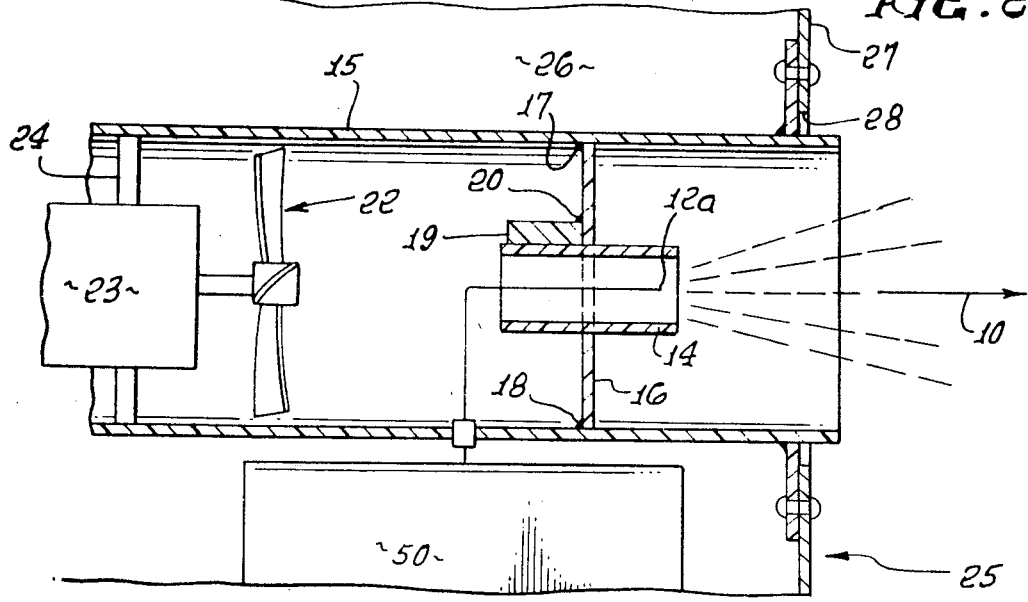
FIG. 2 is an enlarged vertical section on lines 2—2 of FIG. 1.

In accordance with the invention, first and second tip means are provided, to be aimed generally longitudinally forwardly (see arrow 10 in FIG. 2). In the illustrated embodiment, the first and second tip means take the form of first and second tips 11a and 12a respectively at the forward ends of longitudinally elongated needles 11 and 12. The two needles, and their associated tips are laterally spaced apart so that ions of differing polarity may be delivered therefrom, in alternating sequence, with minimum interference.

Figure 1:
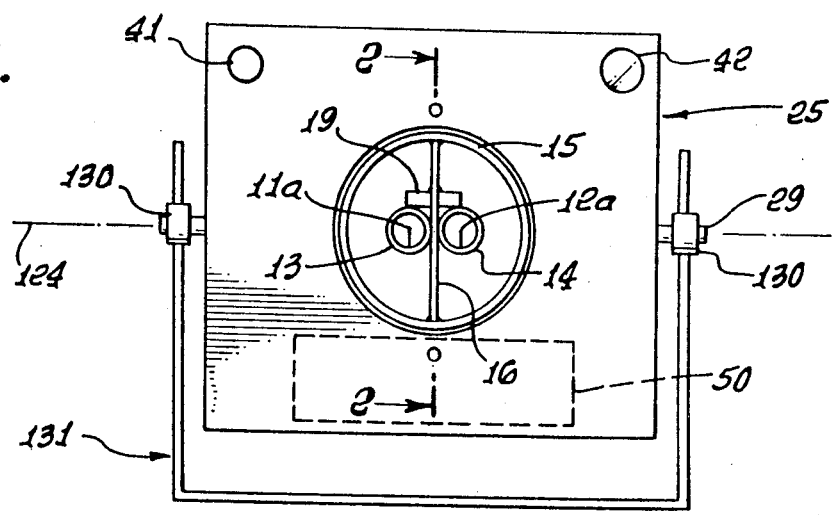
FIG. 1 is a frontal view of apparatus incorporating the invention.

Insulative structure extends about the tip means, and in the example shown takes the form of first and second generally parallel, forwardly elongated plastic tubes 13 and 14 respectively extending about the first and second tips 11a and 12a, as well as about needles 11 and 12. Note that the tips are spaced inwardly from the forward ends of the tubes, for protection and for minimizing mutual interference as respects ion delivery. An outer and larger diameter plastic tube 15 extends about the two smaller tubes, and is also open ended. A vertical strut 16 extends diametrically across the bore of the outer tube and is attached thereto at 17 and 18. A horizontal strap 19 is attached at 20 to the strut, and also to the tops of the two smaller tubes, to support them near the center of the larger tube. Strut 16 extends between the smaller tubes, as seen in FIG. 1. This construction facilitates optimum air flow forwardly through all the tubes, as described below. Insulative tubes 13, 14 and 15 may consist of polyvinyl chloride, or other insulative material such as ABS.

Figure 3:
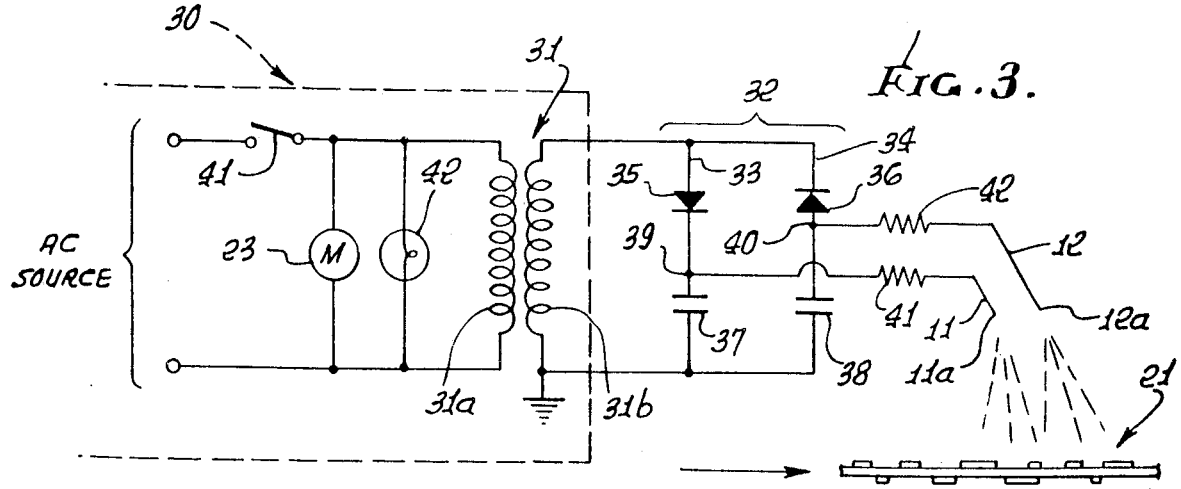
FIG. 3 is a circuit diagram.

Means is also provided to supply flowing gas (such as air) to pass forwardly through the tubes 13–15, thereby to aid in transporting the charged ions, generated by the tips 11a and 12a, beyond the tubes and onto work such as circuit boards indicated at 21 in FIG. 3. Such means is shown in FIG. 2 to include a fan 22 supported and driven to rotate in outer tube 15 by an electric motor 23. The latter may be suitably supported at 24 by tube 15, to provide a very simple and effective construction in combination with all three tubes 13–15. The open-endedness of all the tubes facilitates air flow through and about tubes 13 and 14 to optimally maintain the flow of ions directed toward and onto the work.

Further as appears in FIGS. 1 and 2, structure is provided to pivotally support the outer tube 15 so that the latter and tubes 13 and 14 may pivot as a unit about an axis 124 generally normal to the longitudinal direction 10. As shown, such structure advantageously includes a housing 25 defining an interior zone 26 in which the tubes 13–15 are located, the housing having a front wall 27 with a through opening 28 in alignment with the outer tube 15 and parallel tubes 13 and 14. Support means including trunnions 29 on the housing side walls and bearings 130 on a bracket 131 pivotally support the housing to pivot about horizontal axis 124, whereby the ion generating tips 11a and 12a and associated tubes 13–15 may be selectively aimed at work such as the circuit boards 21. As will be seen, ions of alternately negative and positive polarity may thus be caused to flow onto the circuit board, or boards, to electrically neutralize same.

Further in accordance with the invention, circuit means is provided to supply high voltage of relatively positive polarity to one tip, and high voltage of relatively negative polarity, to the other tip. An example of such circuit means is shown in FIG. 3 to include a source 30 of alternating voltage. That source may comprise an AC, 115 volt, 60 cycle source, and a transformer 31 having a primary coil 31a connected across that source. High voltage derived from the secondary coil 31b is applied through the circuitry 32 to the two tips 11a and 12a. Such circuitry includes parallel branches 33 and 34 connected in series with coil 31b, a first rectifier (as for example a diode) 35 connected in one branch 33, and a second rectifier (as for example a reversed) diode 36 connected in the other branch 34. The first branch 33 also includes first capacitance 37 connected in series with rectifier 35, and the second branch includes second capacitance 38 connected in series with the second rectifier 36. The first tip 11a and needle 11 are connected to the first branch at 39 between the rectifier 35 and capacitor 37; and the second tip 12a and needle 12 are connected to the second branch at 40 between rectifier 36 and capacitor 38. The circuit means also includes isolation resistances 41 and 42 respectively connected between point 39 and needle 11, and between point 40 and needle 12. As one example, when about 3800 VAC is developed across secondary coil 31b, about 6,000 volts positive is developed during one-half cycle at tip 11a, and about 6,000 volts negative is developed during the other half cycle at tip 12a, with circuit elements having values as follows (other component values and voltage ranges being usable);

|   | value or identification |
|---|---|
| diodes | |
| 35 | High voltage rectifier 10,000 PRV, 25 miliamps |
| 36 | High voltage rectifier 10,000 PRIV, 25 miliamps |
| capacitors | |
| 37 | .01 MFD. |
| 38 | .01 MFD. |

(from 500 to 100,000 volts, peak positive and peak negative may be employed at the tips).

| resistance | value or identification |
|---|---|
| 41 | 22 meg ½ Watt |
| 42 | 22 meg ½ Watt or vary to equalize voltage output |

It is found the invention enables electrical neutralization of the components of circuit boards, to eliminate or prevent build-up of static charges that would harm, or interfere with operation of circuit board components.

The circuitry 30, 31 and 32 of FIG. 3 is conveniently contained within zone 50 in the housing. An on-off switch 41 is located on the front wall 27 of the housing; and an on-off indicator light 42 is also located on that front wall. Motor 23 may be electrically connected across the AC source, as shown in FIG. 3. Diodes 35 and 36 are oppositely poled, as shown.

Figure 4:
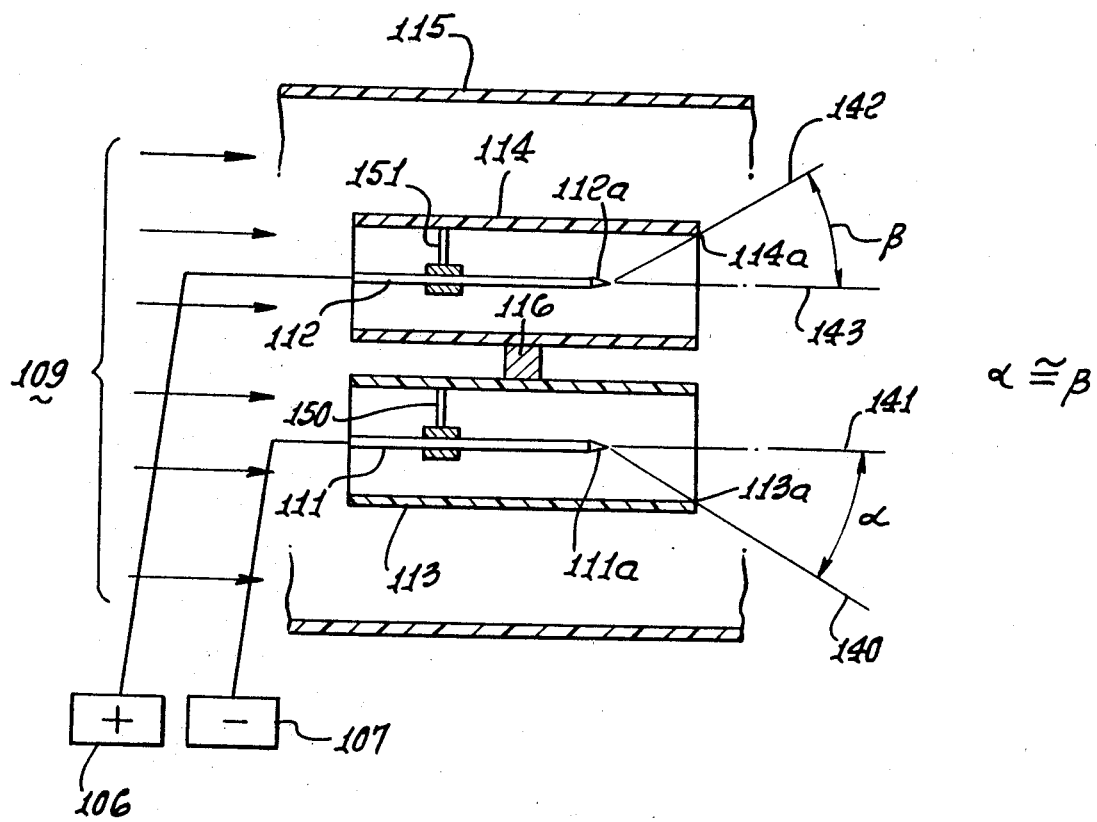
FIGS. 4 and 5 are plan views showing modifications.

In the plan view of FIG. 4, the tubes 113 and 114 correspond to tubes 13 and 14 above, the large diameter tube 115 corresponds to large diameter tube 15, above. Needles 111 and 112 in the tubes project axially forwardly, and they have tips 111a and 112a. The tubes have forward ends 113a and 114a which are circular and spaced forwardly of the tips. In this regard, the tips are located sufficiently rearwardly of the tube forward ends as to optimize, or nearly optimize ion projection forwardly from the needles. Forward air streams through tubes are indicated at 109. A tube mounting strut 116 corresponds to strut 16. Sources of positive and negative voltage appear at 106 and 107, and are connected to the needles as shown. They may take the form of the means described in FIG. 3. Tubes 113, 114 and 115 may consist of insulative plastic material.

More specifically, a line 140 extending from the first tip 111a to forward edge 113a defines an angle $\alpha$ with the axis 141 of the first tube 113. Similarly, a line 142 extending from the second tip 112a to forward edge 114a defines an angle β with the axis 143 of the second tube. Each of the angles α and β is less than about 45° and preferably is between about 30° and 40° for best results in terms of ion production.

Further, the needles and their tips are supported within the tubes, as for example by supports 150 and 151. One or both of the latter may allow adjustment of the supported needle or needles in an axial direction, to vary the spacing of the tip or tips from the forward end or ends of the tubes. Accordingly, for example, if the amount of negative ions produced by tip 111a is too great in relation to the amount of positive ions produced by tip 112a, tip 111a may be adjustably displaced backwardly to decrease its negative ion production. Conversely, tip 112a may be adjustably displaced forwardly to decrease positive ion production if that result is desired. Thus, the relative intensities of positive and negative ion production or dispersal by the tips have an adjustably selected or selectable relationship.

Figure 5:
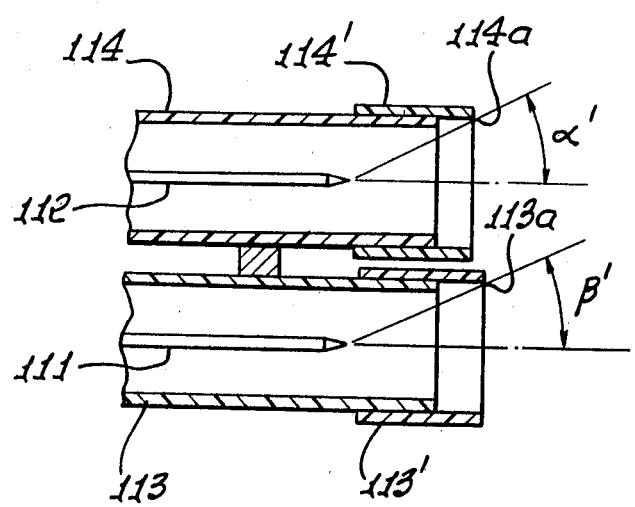

FIG. 5 shows that a similar or the same result can be achieved by adjusting the position of the tube forwardmost ends relative to the tips, which have fixed positions. Note sleeves 113' and 114' on the tubes, defining edges 113a and 114a. The sleeves are slidably adjustable on the tubes, as shown.

Referring now to FIGS. 6 and 7, the illustrated antistatic apparatus includes an electrically insulative synthetic plastic carrier body 300, which is elongated. First and second tip means are carried by that body, and may for example include first metallic tips 301 on an elongated metallic strap 302 received in a first elongated body recess 303 and second metallic tips 304 on an elongated metallic strap 305 received in a second channel or elongated body recess 306. The recesses extend in parallel relation, as do the electrically conductive metallic straps. Thus, the tips extend in first and second longitudinally elongated rows, as shown.

First conductor means is associated with the first tip means to supply voltage of positive polarity to the first tips 301. See for example lead 307 suitably connected to strap 302 to supply voltage from source 308. Second conductor means is associated with the second tip means to supply voltage of negative polarity to the second tips 304. See for example lead 309 suitably connected to strap 305 to supply negative voltage from source 308. The source 308 may have the construction as shown in FIG. 3, for example. As a result, ions of positive polarity are dispensed or dispersed generally forwardly as via streams 312 from the first tips 301; and ions of negative polarity are dispensed or dispersed generally forwardly as via stream 313, both streams directed toward work 314 whose surface is to be statically neutralized. It is found that such neutralization is made possible or enhanced by employing barrier means, such as electrically insulative panel or wall 315, extending generally forwardly to separate the positive ions from the negative ions as they are dispersed forwardly from the tips. That panel extends in a forward and longitudinal plane, toward the work and from a location adjacent the carrier, whereby the positive and negative ions cannot mix while they gain considerable forward velocity toward the work. As a result, the work is bathed in positive and negative ions, for effective neutralization thereof.

If desired, pressurized gas such as air may be supplied from a source 316 and via a line 321, passages 317 and 318 in the body, and ports 319 through the straps 302 and 305 and near the tips, to assist in sweeping the ions forwardly, to enhance the neutralization effect. The panel 315 is shown as attached to the carrier body at 320.

FIGS. 8 and 9 show an electrically insulative carrier body 330 in the form of a nozzle. A "positive" metallic tip 331 is forwardly directed in a first recess 332 in the nozzle forward extent, and a "negative" metallic tip 333 is forwardly directed in a second recess 334 in the nozzle forward extent 335. First electrical conductors 336 and 336a supply positive voltage from source 338 to tip 331; and second electrical conductors 337 and 337a supply negative voltage from source 338 to tip 333. Source 338 may have the same construction as shown in FIG. 3. Positive and negative ion streams appear at 339 and 340, projected forwardly from the recesses 332 and 334, toward work to be neutralized. A barrier in the form of nozzle wall 341 separates the two recesses, and has the same function as wall 315, in FIGS. 6 and 7.

Pressurized gas such as air may be supplied (as from a source such as source 316 in FIG. 6) via suitable ducts 343-349 to exit into the recesses 332 and 334 adjacent the tips and aid in sweeping the ion streams forwardly, toward the work to be neutralized.

In FIGS. 10 and 11, an electrically insulative carrier body 400 is in the form of a bar. It defines multiple forwardly opening recesses such as tubular openings 401, about each of a number of tips 402 spaced along the bar. The tips may comprise metallic needles mounted on a strap 403. The needles are recessed into the openings, from the front side 400a of the bar. Passages are provided to supply air or gas to the recesses, to be drawn forwardly through the recesses, and about the needles, in response to the aspirating action of the forwardly traveling ion streams 404 emanating from the needles. See for example tubular passages or openings 405, which may be continuations of recesses 401. The bar may be in two sections, as shown. A source of positive or negative high voltage is shown at 406. As a result, the needles are continuously swept clear, and do not collect dirt particles or become dirty. Therefore, they project more ions and function more efficiently. Spacing of the needles or tips is typically between about ¼ inch to 12 inches along the bar, strap or wire depends upon intensity of static to be neutralized, and closeness of the tips or emitters to the surfaces to be neutralized.

The device shown in FIG. 12 is like that of FIG. 11; however, side-by-side recesses 411 are found in bar 410, with a barrier 420 therebetween. The barrier functions as does barrier 315 in FIG. 7, or 341 in FIG. 8. Needles 412 and 412a are connected to sources 413 and 413a of positive and negative high voltage, respectively, as in FIGS. 6 and 8. See also bus bars 414 and 414a mounting the needles, and air passing openings 415 and 415a communicating with recesses 411 about the needles.

I claim:
1. In apparatus for generating and dispersing ions,
   (a) first and second tip means aimed generally longitudinally forwardly, said first tip means spaced laterally from said second tip means,
   (b) a circuit means to supply high voltage of relatively positive polarity to the first tip means and high voltage of relatively negative polarity to the second tip means, and
   (c) insulative structure including a barrier extending generally forwardly to separate positive ions dispensed generally forwardly of the first tip means from negative ions dispensed generally forwardly of the second tip means, (d) said insulative structure forming first and second generally parallel and forwardly directed recesses receiving said tip means so that the tip means are substantially entirely located in the recesses, the tip means effectively relatively adjusted spacially relative to the forward ends of the recesses whereby the relative intensities of the positive and negative ions dispersed by the tip means have an adjustably selected relationship.

2. The apparatus of claim 1 wherein said circuit means includes a source of alternating high voltage, first rectifier means connected between said source and said first tip means, and second rectifier means connected between said source and said second tip means.

3. The apparatus of claim 2 wherein said source includes a transformer having a secondary coil, and said circuit means includes parallel branches connected in series with secondary coil, the first rectifier means connected in one of said branches and the second rectifier means connected in the other of said branches.

4. The apparatus of claim 3 wherein the first branch includes first capacitance connected in series with the first rectifier means, and the second branch includes second capacitance connected in series with the second rectifier means, the first tip means is connected to said first branch between the first rectifier means and the first capacitance, and the second tip means is connected to the second branch between the second rectifier means and the second capacitance.

5. The apparatus of claim 2 wherein said circuit means includes resistance connected with said tip means to control the voltages at said tip means.

6. The apparatus of claim 4 wherein the source means includes a transformer having a secondary coil operatively connected with said first and second rectifier means to supply 500 to 100,000 peak positive volts to said first tip means and to supply at least about 500 to 100,000 peak negative volts to said second tip means.

7. The apparatus of claim 1 wherein said insulative structure include first and second generally parallel tubes respectively extending about said first and second tip means.

8. The apparatus of claim 7 wherein said tubes are endwise open, and including means to supply flowing gas to flow forwardly through said tubes.

9. The apparatus of claim 8 wherein said means to supply flowing gas comprises a motor driven fan in gas flow transmitting spaced relation to rearward open ends of said parallel tubes.

10. The combination of claim 1 wherein said circuit means includes circuitry for causing the absolute values of said positive and negative voltages to be approximately equal.

11. The combination of claim 1 wherein said circuit means includes circuitry for causing said positive ions to be generated in time wise alternation with respect to generation of said negative ions.

12. The combination of claim 1 wherein said circuit means includes circuitry for causing both said positive and negative ions to be generated over the same time interval.

13. The apparatus of claim 7 wherein said tubes have forward ends which are spaced forwardly of said first and second tip means.

14. The apparatus of claim 13 including means supporting said tip means to extend within said tube.

15. The apparatus of claim 12 wherein the tubes have forwardly extending central axes, the tip means located proximate said axes.

16. The apparatus of claim 13 wherein a line extending from the first tip means to the forward edge of the first tube defines an angle $\alpha$ with the axis of the first tube, said angle $\alpha$ being less than about 45°.

17. The apparatus of claim 15 wherein a line extending from the second tip means to the forward edge of the second tube defines an angle $\beta$ with the axis of the second tube, said angle $\beta$ being less than about 45°.

18. The combination that includes the apparatus of claim 1 and a circuit board at which said tip means are aimed to direct positive and negative ions onto the board to electrostatically neutralize same.

19. The combination of claim 18 wherein said tip means include tips that extend in rows and said barrier comprises a plate.

20. The combination of claim 1 including means to supply pressurized gas to flow generally forwardly in streams in the paths of said ions and at opposite sides of said barrier.

21. The combination of claim 1 wherein said structure defines a nozzle, said recesses located in the forward end of said nozzle, said barrier separating said recesses.

22. The combination of claim 21 including means to supply pressurized gas to flow generally forwardly in streams in the paths of said ions and at opposite sides of said barrier.

23. The combination of claim 18 wherein said circuit board carries electrical components exposed to said ions.

* * * * *